United States Patent
Zeng et al.

(10) Patent No.: US 9,171,516 B2
(45) Date of Patent: Oct. 27, 2015

(54) GATE DRIVER ON ARRAY CIRCUIT

(71) Applicant: Shenzhen China Star Optoelectronics Technology Co., Ltd., Shenzhen, Guangdong (CN)

(72) Inventors: Limei Zeng, Shenzhen (CN); Shihchyn Lin, Shenzhen (CN)

(73) Assignee: Shenzhen China Star Optoelectronics Technology Co., Ltd, Shenzhen, Guangdong ( * ) Notice: Subject to any disclaimer, the term of this patent is extended or adjusted under 35 U.S.C. 154(b) by 204 days.

(21) Appl. No.: 14/003,009

(22) PCT Filed: Jul. 9, 2013

(86) PCT No.: PCT/CN2013/079024
§ 371 (c)(1),
(2) Date: Sep. 4, 2013

(87) PCT Pub. No.: WO2015/000187
PCT Pub. Date: Jan. 8, 2015

(65) Prior Publication Data
US 2015/0009113 A1    Jan. 8, 2015

(30) Foreign Application Priority Data
Jul. 3, 2013 (CN) .......................... 2013 1 0277412

(51) Int. Cl.
G09G 3/36 (2006.01)
G11C 19/18 (2006.01)
G11C 19/28 (2006.01)

(52) U.S. Cl.
CPC ............ *G09G 3/3677* (2013.01); *G11C 19/184* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 8,019,039 B1 * | 9/2011 | Tsai | 377/64 |
| 9,013,390 B2 * | 4/2015 | Yang et al. | 345/100 |
| 2004/0189585 A1 * | 9/2004 | Moon | 345/100 |

(Continued)

FOREIGN PATENT DOCUMENTS

| | | |
|---|---|---|
| CN | 1758317 A | 4/2006 |
| CN | 101364392 A | 2/2009 |

(Continued)

*Primary Examiner* — Joseph Haley
*Assistant Examiner* — Emily Frank
(74) *Attorney, Agent, or Firm* — Andrew C. Cheng (57) ABSTRACT

The present invention provides a gate driver on array circuit. The gate driver on array circuit comprises: multiple gate driver on array units connected in cascade. The n-th gate driver on array unit of the gate driver on array circuit comprises a (n−2)-th signal input terminal 21, a (n+2)-th signal input terminal 22, a clock signal first input terminal 23, a clock signal second input terminal 24, a first low-level input terminal 25, a second low-level input terminal 26, a first output terminal 27 and a second output terminal 28. The n-th gate driver on array unit further comprises: a pulling-up driving unit 32, a pulling-up unit 34, a first to a third pulling-down unit 36, 37, 38. The present invention adds a second low-level signal, which uses the second low-level to decrease the voltage difference ($V_{gs}$) between the gate and the source of the thin film transistor of the first output terminal, so that the leakage current of the thin film transistor is less and can be controlled precisely.

14 Claims, 5 Drawing Sheets

(56) References Cited

U.S. PATENT DOCUMENTS

2010/0171728 A1   7/2010  Han
2013/0113772 A1*  5/2013  Kang et al. .................. 345/211
2013/0135284 A1*  5/2013  Tseng et al. ................. 345/212

FOREIGN PATENT DOCUMENTS

| CN | 101752006 A | 6/2010 |
| CN | 103150987 A | 6/2013 |
| CN | 102411917 A | 4/2014 |

* cited by examiner

GATE DRIVER ON ARRAY CIRCUIT

BACKGROUND OF THE INVENTION

1. Field of the Invention

The present invention relates to the field of display techniques, and in particular to a gate driver on array circuit.

2. The Related Arts

Liquid crystal display (LCD) has many advantages of thin body, energy saving, and no radiation, which has been widely used. The existing LCD in the market is mostly backlight LCD, which comprises liquid crystal panel and backlight module. The working principle of the liquid panel is to provide liquid crystal molecules between two parallel glass substrates, and to provide driving voltage on the two glass substrates to control the rotating direction of the liquid crystal molecules, so that the light from the backlight module is refracted and generates the picture.

Recently, the development of LCD tends to high integration and low costs. A very important technology is gate drive on array (GOA) mass production technology, which uses gate drive on array technology to integrate the gate switching circuits on the array substrate of the liquid crystal panel, acting as shift register, so that the gate driver IC can be saved and then reduces the product costs from material costs and process steps.

Figure 1:
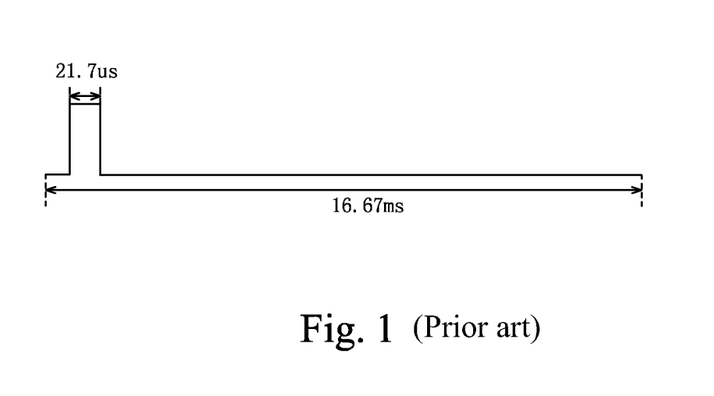
FIG. 1 is a schematic diagram illustrating the time composition of the scanning line scanning a frame according to the existing technology.
Figure 2:
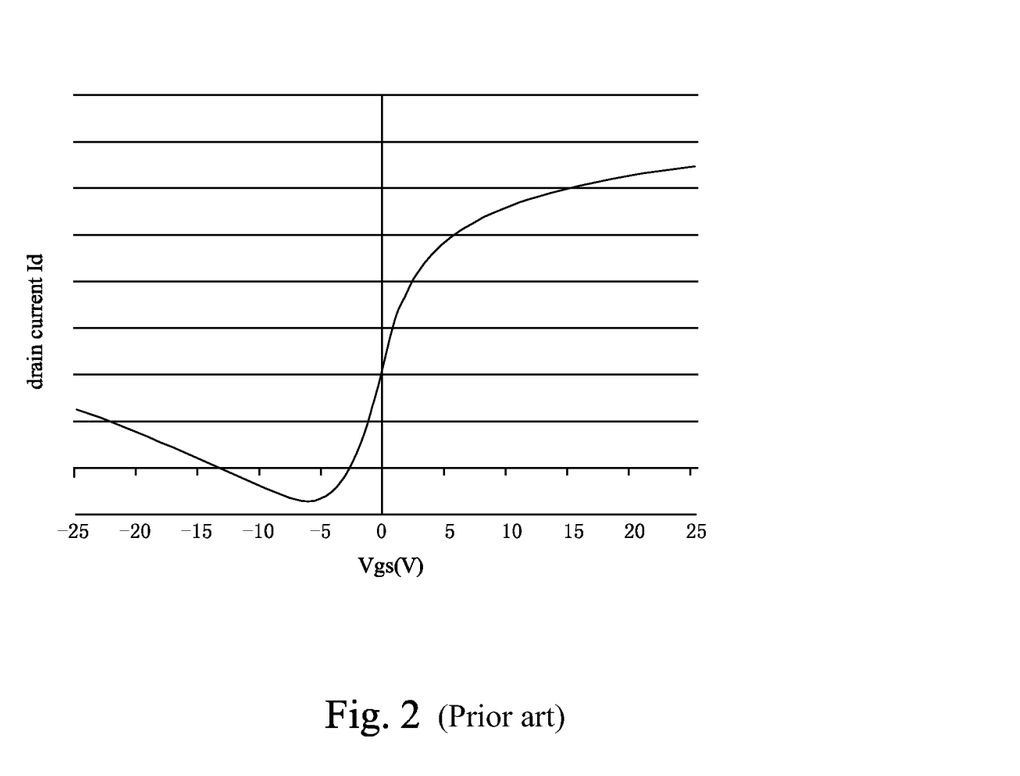
FIG. 2 is I-V curve of thin film transistor.

The purpose of the gate driver on array circuit is to output the scanning waveform output from the integrated circuit through circuit operation, so that the pixel switch is turned on, and then input the data signal to the indium tin oxide (ITO) conducting electrode. After inputting the data signal, hold the data signal until the next frame is turned on. During the circuit operation, the turning off (holding) time of the scanning circuit is much longer than the scanning time. Referring to FIG. 1, assuming the resolution is 1366×768, the turning on time of a scanning circuit is 2.17 μs, and the scanning time of one frame is 16.67 ms (60 Hz). Because a scanning circuit is turned off in the remaining time of one frame after turning on, the requirement of stability characteristics of the thin film transistor (TFT) in the gate driver on array circuit is very high in this time. However, one driver circuit comprises more than ten thin film transistors, and it is difficult to keep each thin film transistor having stable switching characteristics during actual semiconductor manufacturing process. Therefore, the important thin film transistor (such as thin film transistor in each driver circuit output terminal) in the driver circuit requires fairly good switching characteristics Each conventional driver circuit only has one $V_{ss}$ signal. When the driver circuit is turned off, the voltage difference $V_{gs}$ between the gate and the source of the thin film transistor at the output terminal is 0V. Referring to FIG. 2, it is I-V curve of thin film transistor. It can be known that the current flowing through the thin film transistor is still in the linear region when $V_{gs}$ is 0V. The leakage current of the thin film transistor is relatively large, which is hard to control precisely and not good for display quality of the LCD.

SUMMARY OF THE INVENTION

The object of the present invention is to provide a gate driver on array circuit, the leakage current of the thin film transistor of the pulling-up unit at the first output terminal of the gate driver on array unit thereof is smaller, which can be controlled precisely and beneficial to improve the display quality of the LCD.

In order to achieve the above objective, the present invention provides a gate driver on array circuit, comprising multiple gate driver on array units connected in cascade, wherein the n-th gate driver on array unit of the gate driver on array circuit comprises a (n−2)-th signal input terminal, a (n+2)-th signal input terminal, a clock signal first input terminal, a clock signal second input terminal, a first low-level input terminal, a second low-level input terminal, a first output terminal and a second output terminal, wherein the first output terminal of the n-th gate driver on array unit is used to drive the active region of the array substrate;

wherein, when the n-th gate driver on array unit is one of the third to the last first gate driver on array units, the (n−2)-th signal input terminal of the n-th gate driver on array unit is electrically connected to the second output terminal of the (n−2)-th gate driver on array unit; when the n-th gate driver on array unit is the first or the second gate driver on array unit, the (n−2)-th signal input terminal is used to input a pulse activation signal; when the n-th gate driver on array unit is one of the first to the last third gate driver on array units, the second output terminal of the n-th gate driver on array unit is electrically connected to the (n−2)-th signal input terminal of the (n+2)-th gate driver on array unit, and the (n+2)-th signal input terminal of the n-th gate driver on array unit is electrically connected to the first output terminal of the (n+2)-th gate driver on array unit; when the n-th gate driver on array unit is the last first or the last second gate driver on array unit, the second output terminal of the n-th gate driver on array unit is suspended, and the (n+2)-th signal input terminal is used to input a pulse activation signal; the first low-level input terminal is used to input a first low-level, the second low-level input terminal is used to input a second low-level, and the second low-level is less than the first low-level; the n-th gate driver on array unit of the gate driver on array circuit further comprises:

a pulling-up driving unit, which is electrically connected with the (n−2)-th signal input terminal;

a pulling-up unit, which is electrically connected with the pulling-up driving unit, the clock signal first input terminal, the first output terminal and the second output terminal;

a first pulling-down unit, which is electrically connected with the clock signal first input terminal, the first low-level input terminal, the second low-level input terminal, the pulling-up driving unit and the pulling-up unit;

a second pulling-down unit, which is electrically connected with the clock signal second input terminal, the first low-level input terminal, the second low-level input terminal, the first pulling-down unit, the pulling-up driving unit and the pulling-up unit;

a third pulling-down unit, which is electrically connected with the (n+2)-th signal input terminal, the first low-level input terminal, the pulling-up driving unit, the pulling-up unit, the first pulling-down unit, the second pulling-down unit and the first output terminal.

The input signals of the clock signal first input terminal and the clock signal second input terminal are a first clock signal, a second clock signal, a third clock signal or a fourth clock signal, the first clock signal and the third clock signal have opposite phases, the second clock signal and the fourth clock signal have opposite phases, and the waveforms of the first clock signal, the third clock signal and the second clock signal, the fourth clock signal are the same, but the initial phases are different.

When the input signals of the clock signal first input terminal and the clock signal second input terminal of the n-th gate driver on array unit of the gate driver on array circuit are respectively the first clock signal and the third clock signal, the input signals of the clock signal first input terminal and the clock signal second input terminal of the (n+1)-th gate driver on array unit of the gate driver on array circuit are respectively the second clock signal and the fourth clock signal.

When the input signal of the clock signal first input terminal of the n-th gate driver on array unit of the gate driver on array circuit is the first clock signal, the input signal of the clock signal second input terminal of the n-th gate driver on array unit of the gate driver on array circuit is the third clock signal, the input signal of the clock signal first input terminal of the (n+2)-th gate driver on array unit of the gate driver on array circuit is the third clock signal, and the input signal of the clock signal second input terminal of the (n+2)-th gate driver on array unit of the gate driver on array circuit is the first clock signal.

When the input signal of the clock signal first input terminal of the (n+1)-th gate driver on array unit of the gate driver on array circuit is the second clock signal, the input signal of the clock signal second input terminal of the (n+1)-th gate driver on array unit of the gate driver on array circuit is the fourth clock signal, the input signal of the clock signal first input terminal of the (n+3)-th gate driver on array unit of the gate driver on array circuit is the fourth clock signal, and the input signal of the clock signal second input terminal of the (n+3)-th gate driver on array unit of the gate driver on array circuit is the second clock signal.

The pulling-up driving unit is a first thin film transistor, the first thin film transistor comprises a first gate, a first source and a first drain, the first gate and the first source are electrically connected to the (n−2)-th signal input terminal, and the first drain is electrically connected with the first to the third pulling-down units and the pulling-up unit, respectively.

The pulling-up unit comprises a capacitor, a second thin film transistor and a third thin film transistor, the second thin film transistor comprises a second gate, a second source and a second drain, the third thin film transistor comprises a third gate, a third source and a third drain, the second gate is electrically connected with a terminal of the capacitor, the first drain, the third gate and the third pulling-down unit, respectively, the second source is electrically connected with the third drain and the clock signal first input terminal, the second drain is electrically connected with the second output terminal, and the third source is electrically connected with the first output terminal, the third pulling-down unit and the other terminal of the capacitor.

The first pulling-down unit comprises a fourth to a seventh thin film transistor, the fourth thin film transistor comprises a fourth gate, a fourth source and a fourth drain, the fifth thin film transistor comprises a fifth gate, a fifth source and a fifth drain, the sixth thin film transistor comprises a sixth gate, a sixth source and a sixth drain, the seventh thin film transistor comprises a seventh gate, a seventh source and a seventh drain, the fourth gate and the fourth source are electrically connected to the clock signal first input terminal, the fourth drain is electrically connected with the fifth source, the sixth gate and the seventh gate, the fifth gate is electrically connected with the first drain, the seventh source and the second pulling-down unit, the fifth drain is electrically connected to the second low-level input terminal, the sixth source is electrically connected with the other terminal of the capacitor, the second pulling-down unit and the first output terminal, the sixth drain is electrically connected with the first low-level input terminal, and the seventh drain is electrically connected with the second low-level input terminal.

The second pulling-down unit comprises an eighth to an eleventh thin film transistor, the eighth thin film transistor comprises an eighth gate, an eighth source and an eighth drain, the ninth thin film transistor comprises an ninth gate, an ninth source and an ninth drain, the tenth thin film transistor comprises a tenth gate, a tenth source and a tenth drain, the eleventh thin film transistor comprises an eleventh gate, an eleventh source and an eleventh drain, the eighth gate and the eighth drain are electrically connected to the clock signal second input terminal, the eighth source is electrically connected with the ninth drain, the tenth gate and the eleventh gate, the ninth gate is electrically connected with the first drain, the eleventh source, the fifth gate and the seventh source, the ninth source is electrically connected to the second low-level input terminal, the tenth drain is electrically connected with the other terminal of the capacitor, the sixth source and the first output terminal, the tenth source is electrically connected with the first low-level input terminal, and the eleventh drain is electrically connected with the second low-level input terminal.

The third pulling-down unit comprises a twelfth and a thirteenth thin film transistor, the twelfth thin film transistor comprises a twelfth gate, a twelfth source and a twelfth drain, the thirteenth thin film transistor comprises a thirteenth gate, a thirteenth source and a thirteenth drain, the twelfth gate is electrically connected with the thirteenth gate and the (n+2)-th signal input terminal, the twelfth drain is electrically connected with the first drain, the other terminal of the capacitor, the second gate and the third gate, the twelfth source is electrically connected with the first low-level input terminal and the thirteenth drain, and the thirteenth source is electrically connected with the first output terminal and the third source.

The present invention further provides a gate driver on array circuit, comprising multiple gate driver on array units connected in cascade, wherein the n-th gate driver on array unit of the gate driver on array circuit comprises a (n−2)-th signal input terminal, a (n+2)-th signal input terminal, a clock signal first input terminal, a clock signal second input terminal, a first low-level input terminal, a second low-level input terminal, a first output terminal and a second output terminal, wherein the first output terminal of the n-th gate driver on array unit is used to drive the active region of the array substrate;

wherein, when the n-th gate driver on array unit is one of the third to the last first gate driver on array units, the (n−2)-th signal input terminal of the n-th gate driver on array unit is electrically connected to the second output terminal of the (n−2)-th gate driver on array unit; when the n-th gate driver on array unit is the first or the second gate driver on array unit, the (n−2)-th signal input terminal is used to input a pulse activation signal; when the n-th gate driver on array unit is one of the first to the last third gate driver on array units, the second output terminal of the n-th gate driver on array unit is electrically connected to the (n−2)-th signal input terminal of the (n+2)-th gate driver on array unit, and the (n+2)-th signal input terminal of the n-th gate driver on array unit is electrically connected to the first output terminal of the (n+2)-th gate driver on array unit; when the n-th gate driver on array unit is the last first or the last second gate driver on array unit, the second output terminal of the n-th gate driver on array unit is suspended, and the (n+2)-th signal input terminal is used to input a pulse activation signal; the first low-level input terminal is used to input a first low-level, the second low-level input terminal is used to input a second low-level, and the second low-level is less than the first low-level; the n-th gate driver on array unit of the gate driver on array circuit further comprises:
a pulling-up driving unit, which is electrically connected with the (n−2)-th signal input terminal;
a pulling-up unit, which is electrically connected with the pulling-up driving unit, the clock signal first input terminal, the first output terminal and the second output terminal, respectively;

a first pulling-down unit, which is electrically connected with the clock signal first input terminal, the first low-level input terminal, the second low-level input terminal, the pulling-up driving unit and the pulling-up unit;

a second pulling-down unit, which is electrically connected with the clock signal second input terminal, the first low-level input terminal, the second low-level input terminal, the first pulling-down unit, the pulling-up driving unit and the pulling-up unit;

a third pulling-down unit, which is electrically connected with the (n+2)-th signal input terminal, the first low-level input terminal, the pulling-up driving unit, the pulling-up unit, the first pulling-down unit, the second pulling-down unit and the first output terminal;

wherein, the input signals of the clock signal first input terminal and the clock signal second input terminal are a first clock signal, a second clock signal, a third clock signal or a fourth clock signal, the first clock signal and the third clock signal have opposite phases, the second clock signal and the fourth clock signal have opposite phases, and the waveforms of the first clock signal, the third clock signal and the second clock signal, the fourth clock signal are the same, but the initial phases are different;

wherein, when the input signals of the clock signal first input terminal and the clock signal second input terminal of the n-th gate driver on array unit of the gate driver on array circuit are respectively the first clock signal and the third clock signal, the input signals of the clock signal first input terminal and the clock signal second input terminal of the (n+1)-th gate driver on array unit of the gate driver on array circuit are respectively the second clock signal and the fourth clock signal;

wherein, when the input signal of the clock signal first input terminal of the n-th gate driver on array unit of the gate driver on array circuit is the first clock signal, the input signal of the clock signal second input terminal of the n-th gate driver on array unit of the gate driver on array circuit is the third clock signal, the input signal of the clock signal first input terminal of the (n+2)-th gate driver on array unit of the gate driver on array circuit is the third clock signal, and the input signal of the clock signal second input terminal of the (n+2)-th gate driver on array unit of the gate driver on array circuit is the first clock signal;

wherein, when the input signal of the clock signal first input terminal of the (n+1)-th gate driver on array unit of the gate driver on array circuit is the second clock signal, the input signal of the clock signal second input terminal of the (n+1)-th gate driver on array unit of the gate driver on array circuit is the fourth clock signal, the input signal of the clock signal first input terminal of the (n+3)-th gate driver on array unit of the gate driver on array circuit is the fourth clock signal, and the input signal of the clock signal second input terminal of the (n+3)-th gate driver on array unit of the gate driver on array circuit is the second clock signal;

wherein, the pulling-up driving unit is a first thin film transistor, the first thin film transistor comprises a first gate, a first source and a first drain, the first gate and the first source are electrically connected to the (n−2)-th signal input terminal, and the first drain is electrically connected with the first to the third pulling-down units and the pulling-up unit, respectively.

The pulling-up unit comprises a capacitor, a second thin film transistor and a third thin film transistor, the second thin film transistor comprises a second gate, a second source and a second drain, the third thin film transistor comprises a third gate, a third source and a third drain, the second gate is electrically connected with a terminal of the capacitor, the first drain, the third gate and the third pulling-down unit, respectively, the second source is electrically connected with the third drain and the clock signal first input terminal, the second drain is electrically connected with the second output terminal, and the third source is electrically connected with the first output terminal, the third pulling-down unit and the other terminal of the capacitor.

The first pulling-down unit comprises a fourth to a seventh thin film transistor, the fourth thin film transistor comprises a fourth gate, a fourth source and a fourth drain, the fifth thin film transistor comprises a fifth gate, a fifth source and a fifth drain, the sixth thin film transistor comprises a sixth gate, a sixth source and a sixth drain, the seventh thin film transistor comprises a seventh gate, a seventh source and a seventh drain, the fourth gate and the fourth source are electrically connected to the clock signal first input terminal, the fourth drain is electrically connected with the fifth source, the sixth gate and the seventh gate, the fifth gate is electrically connected with the first drain, the seventh source and the second pulling-down unit, the fifth drain is electrically connected to the second low-level input terminal, the sixth source is electrically connected with the other terminal of the capacitor, the second pulling-down unit and the first output terminal, the sixth drain is electrically connected with the first low-level input terminal, and the seventh drain is electrically connected with the second low-level input terminal.

The second pulling-down unit comprises an eighth to an eleventh thin film transistor, the eighth thin film transistor comprises an eighth gate, an eighth source and an eighth drain, the ninth thin film transistor comprises an ninth gate, an ninth source and an ninth drain, the tenth thin film transistor comprises a tenth gate, a tenth source and a tenth drain, the eleventh thin film transistor comprises an eleventh gate, an eleventh source and an eleventh drain, the eighth gate and the eighth drain are electrically connected to the clock signal second input terminal, the eighth source is electrically connected with the ninth drain, the tenth gate and the eleventh gate, the ninth gate is electrically connected with the first drain, the eleventh source, the fifth gate and the seventh source, the ninth source is electrically connected to the second low-level input terminal, the tenth drain is electrically connected with the other terminal of the capacitor, the sixth source and the first output terminal, the tenth source is electrically connected with the first low-level input terminal, and the eleventh drain is electrically connected with the second low-level input terminal.

The third pulling-down unit comprises a twelfth and a thirteenth thin film transistor, the twelfth thin film transistor comprises a twelfth gate, a twelfth source and a twelfth drain, the thirteenth thin film transistor comprises a thirteenth gate, a thirteenth source and a thirteenth drain, the twelfth gate is electrically connected with the thirteenth gate and the (n+2)-th signal input terminal, the twelfth drain is electrically connected with the first drain, the other terminal of the capacitor, the second gate and the third gate, the twelfth source is electrically connected with the first low-level input terminal and the thirteenth drain, and the thirteenth source is electrically connected with the first output terminal and the third source.

The beneficial effects of the present invention are as follows.

The gate driver on array circuit according to the present invention adds a second low-level signal in the gate driver on array unit, which uses the second low-level to decrease the voltage difference ($V_{gs}$) between the gate and the source of the thin film transistor of the first output terminal when the scanning circuit is turned off, so that the leakage current of the thin film transistor is smaller, which can be controlled precisely and beneficial to improve the display quality of the LCD.

In order to more clearly describe the embodiments in the present invention or the technical solutions in the prior art, the detailed descriptions of the present invention and the accompanying drawings are as follows. However, the drawings and descriptions are only used as reference, which is not intended to limit the present invention.

BRIEF DESCRIPTION OF THE DRAWINGS

The detailed descriptions accompanying drawings and the embodiment of the present invention are as follows, which allows the technical solutions and other beneficial effects of the present invention more obvious.

DETAILED DESCRIPTION OF THE PREFERRED EMBODIMENTS

In order to more clearly describe the technical solutions and the effects in the present invention, the preferred embodiment of the present invention accompanying drawings are described in detail as follows.

Figure 3:
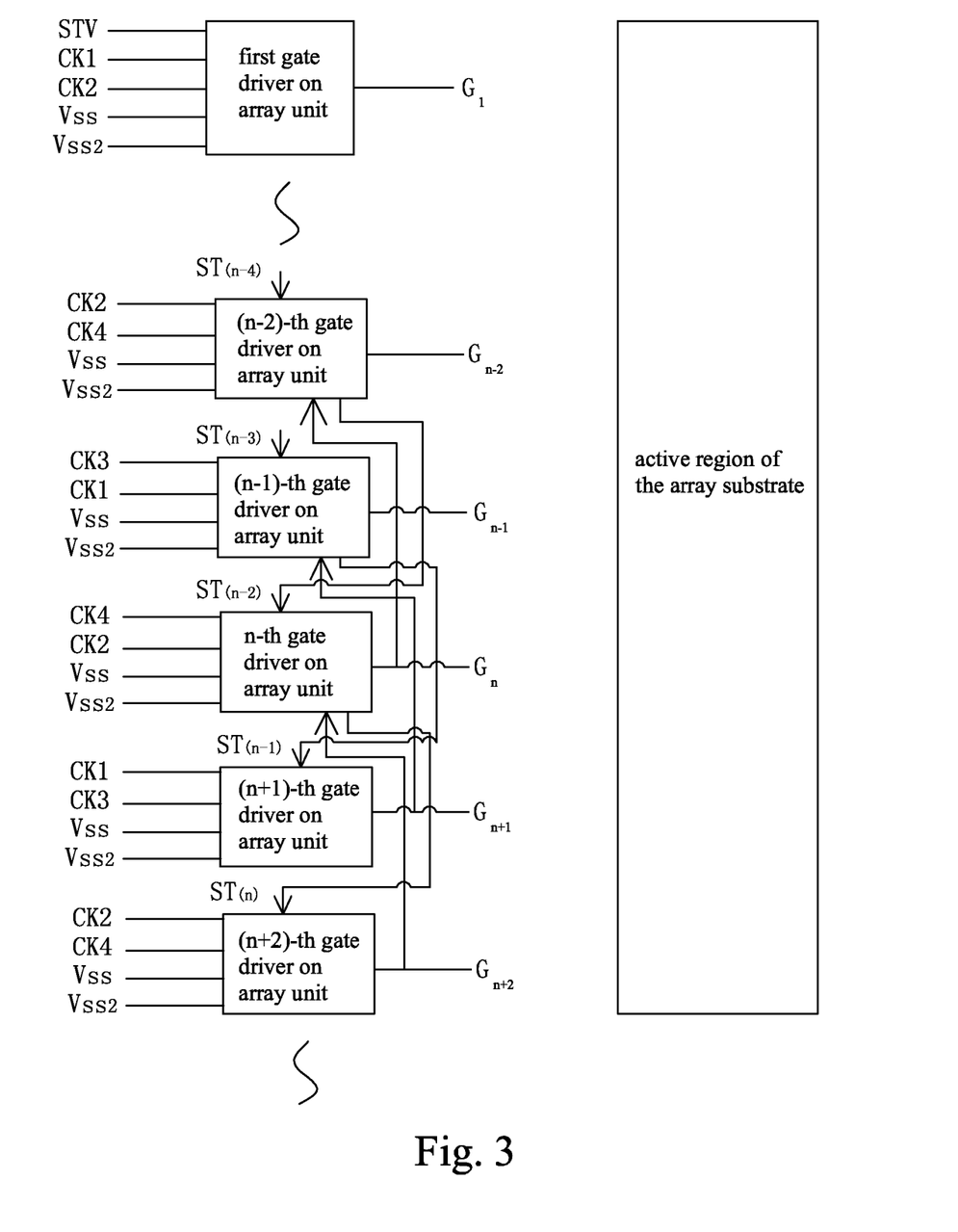
FIG. 3 is a structure of the gate driver on array circuit according to the present invention.
Figure 4:
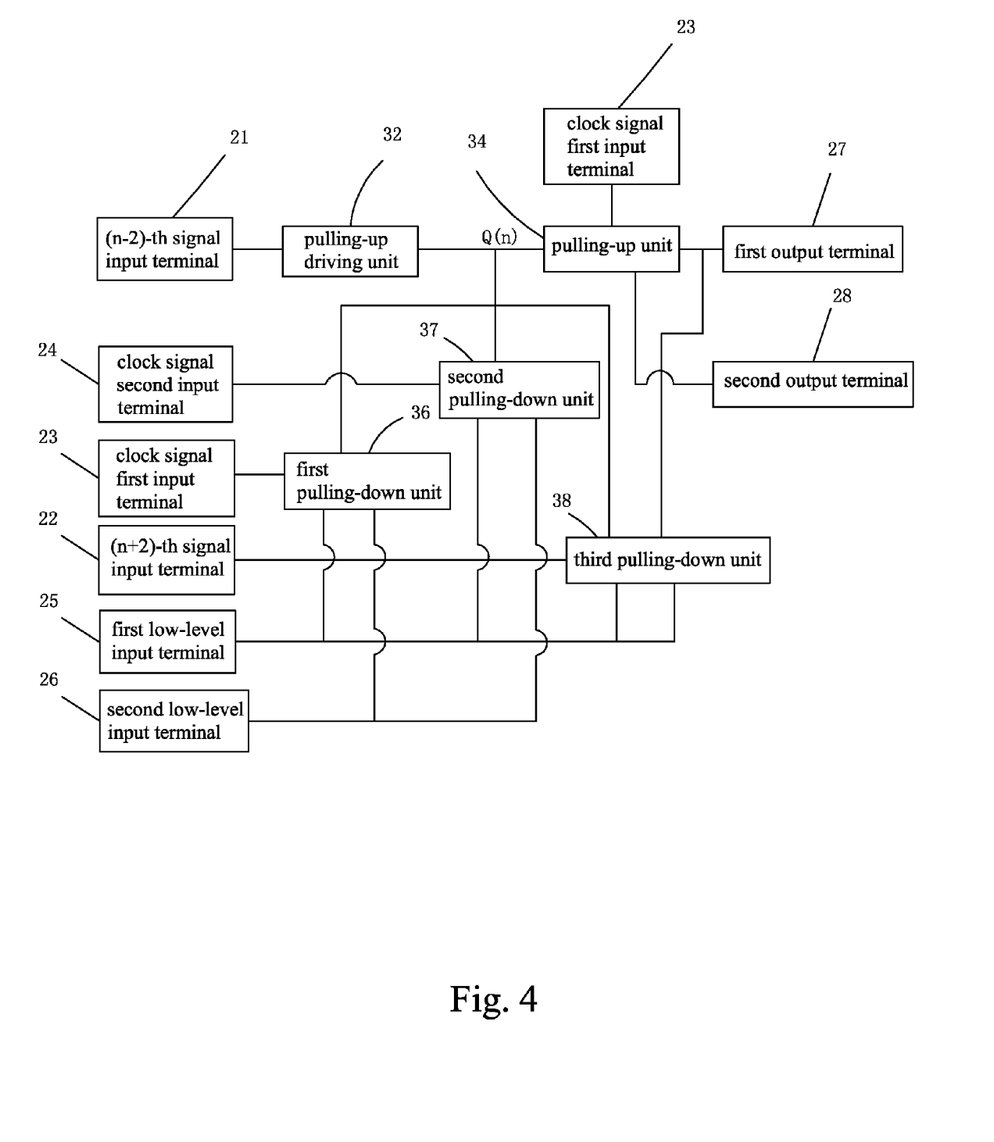
FIG. 4 is a structure of the gate driver on array unit according to the present invention.
Figure 5:
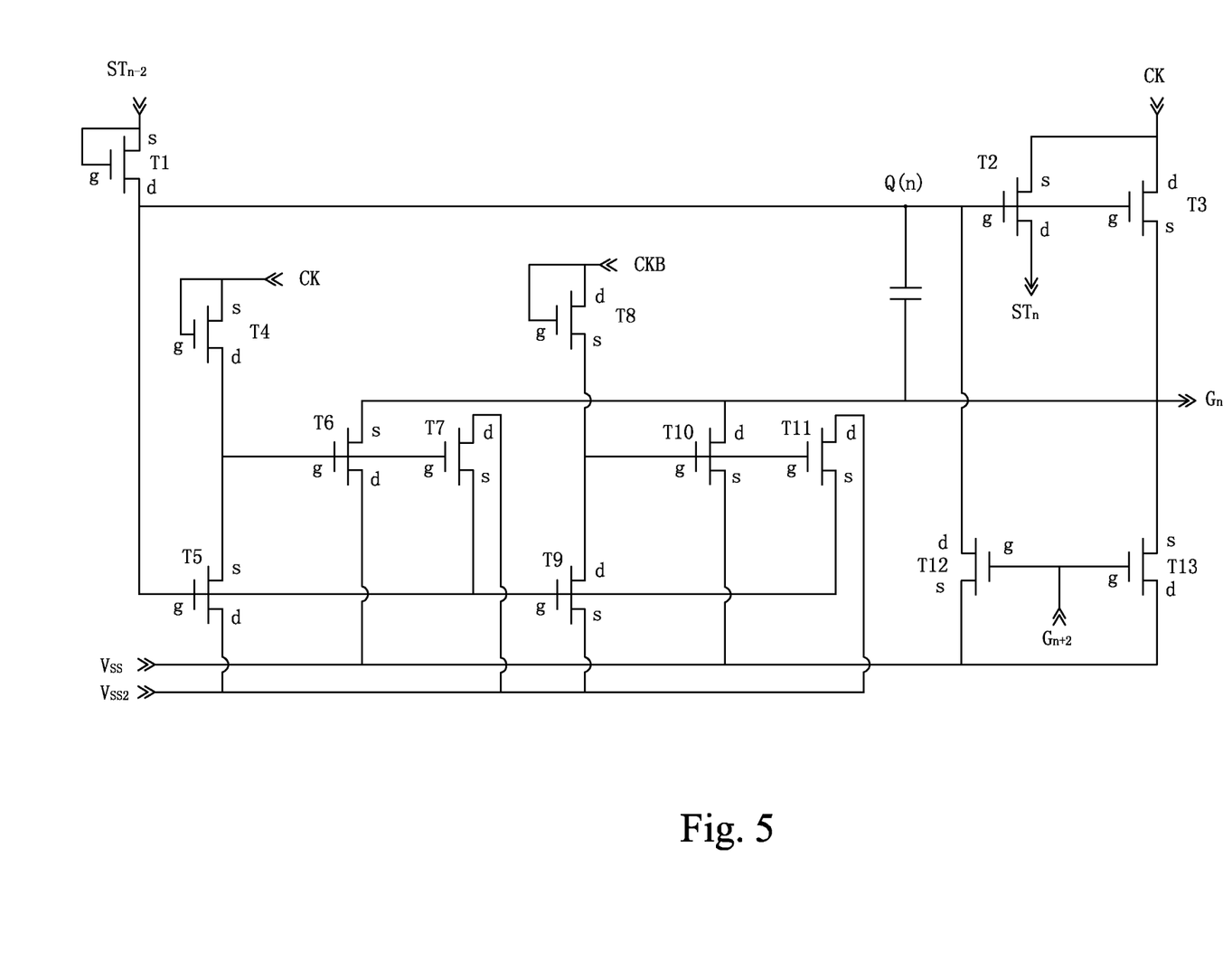
FIG. 5 is a circuit diagram of the gate driver on array unit according to the present invention.

Referring to FIGS. 3 to 5, the present invention provides a gate driver on array circuit, comprising multiple gate driver on array units connected in cascade. The n-th gate driver on array unit of the gate driver on array circuit comprises a (n−2)-th signal input terminal ($ST_{n-2}$) 21, a (n+2)-th signal input terminal ($G_{n+2}$) 22, a clock signal first input terminal 23, a clock signal second input terminal 24, a first low-level input terminal 25, a second low-level input terminal 26, a first output terminal ($G_n$) 27 and a second output terminal ($ST_n$) 28.

The connections within the gate driver on array units connected in cascade have the same structure, except the first two and the last two gate driver on array units. The first output terminal ($G_n$) 27 of the n-th gate driver on array unit is used to drive the active region of the array substrate. When the n-th gate driver on array unit is one of the third to the last first gate driver on array units, the (n−2)-th signal input terminal ($ST_{n-2}$) 21 of the n-th gate driver on array unit is electrically connected to the second output terminal ($ST_n$) 28 of the (n−2)-th gate driver on array unit. When the n-th gate driver on array unit is the first or the second gate driver on array unit, the (n−2)-th signal input terminal ($ST_{n-2}$) 21 is used to input a pulse activation signal, which is STV shown in FIG. 3. When the n-th gate driver on array unit is one of the first to the last third gate driver on array units, the second output terminal ($ST_n$) 28 of the n-th gate driver on array unit is electrically connected to the (n−2)-th signal input terminal ($ST_{n-2}$) 21 of the (n+2)-th gate driver on array unit, and the (n+2)-th signal input terminal ($G_{n+2}$) 22 of the n-th gate driver on array unit is electrically connected to the first output terminal ($G_n$) 27 of the (n+2)-th gate driver on array unit. When the n-th gate driver on array unit is the last first or the last second gate driver on array unit, the second output terminal ($ST_n$) 28 of the n-th gate driver on array unit is suspended, and the (n+2)-th signal input terminal ($G_{n+2}$) 22 is used to input a pulse activation signal. In the present embodiment, the second low-level $V_{ss2}$ of the second low-level input terminal 26 is less than the first low-level $V_{ss}$ of the first low-level input terminal 25. During the turning off (holding) time of the pixel switch, it uses the second low-level $V_{ss2}$ to pull down the gate voltage $V_g$ of the third thin film transistor T3 in a pulling-up unit 34, so that the voltage between the gate g and the source s of the third thin film transistor T3 in the pulling-up unit 34 is less than 0V, which reduces the leakage current, increases the Control accuracy of the third thin film transistor T3, and improves the display quality.

Referring to FIG. 4, specifically, the n-th gate driver on array unit of the gate driver on array circuit comprises: a pulling-up driving unit 32, a pulling-up unit 34, and a first to a third pulling-down unit 36, 37, 38. The connecting relationships within each units and the terminals of the gate driver on array units are as follows:

the pulling-up driving unit 32 is electrically connected with the (n−2)-th signal input terminal ($ST_{n-2}$) 21, the pulling-up unit 34, and the first to the third pulling-down unit 36, 37, 38; the pulling-up unit 34 is electrically connected with the pulling-up driving unit 32, the clock signal first input terminal 23, the first output terminal ($G_n$) 27, the second output terminal ($ST_n$) 28, and the first to the third pulling-down unit 36, 37, 38; the first pulling-down unit 36 is electrically connected with the clock signal first input terminal 23, the first low-level input terminal 25, the second low-level input terminal 26, the pulling-up driving unit 32, and the second to the third pulling-down unit 37, 38; the second pulling-down unit 37 is electrically connected with the clock signal second input terminal 24, the first low-level input terminal 25, the second low-level input terminal 26, the first pulling-down unit 36, the third pulling-down unit 38, the pulling-up driving unit 32, and the pulling-up unit 34; the third pulling-down unit 38 is electrically connected with the first low-level input terminal 25, the pulling-up driving unit 32, the pulling-up unit 34, the first output terminal ($G_n$) 27, the (n+2)-th signal input terminal ($G_{n+2}$) 22, and the first to the second pulling-down unit 36, 37.

In the conventional gate driver on array circuit, all the pulling-down point, including Q(n) and G(n), are connected to a low-level (that is the first low-level $V_{ss}$ according to the present invention), so that the pixel switch is turned off (held). The present invention connects the pulling-down point Q(n) to the second low-level $V_{ss2}$, and connects the pulling-down point G(n) to the first low-level $V_{ss}$, which can adjust the value of the second low $V_{ss2}$, pull further down the gate voltage $V_g$ of the third thin film transistor T3 of the pulling-up unit 34 when the pixel switch is turned off (held), and then reduce the leakage current of the third thin film transistor T3. Assuming the value of the second low $V_{ss2}$ is −10V and the voltage value of the clock signal is −8V, the voltage of the gate g of the third thin film transistor T3 of the pulling-up unit 34 is −10−(−8)=−2V after being pulled-down by the second low $V_{ss2}$, so that the value $V_{gs}$ of the third thin film transistor T3 is close to the minimum area of the leakage current. Combining with the prior art shown in FIG. 2, it can be known that the corresponding region of −2V is closer to the lowest point of the leakage current, which is smaller than that when 0V, so that the third thin film transistor T3 of the pulling-up unit 34 can be under more secure turning off (holding) condition.

Figure 6:
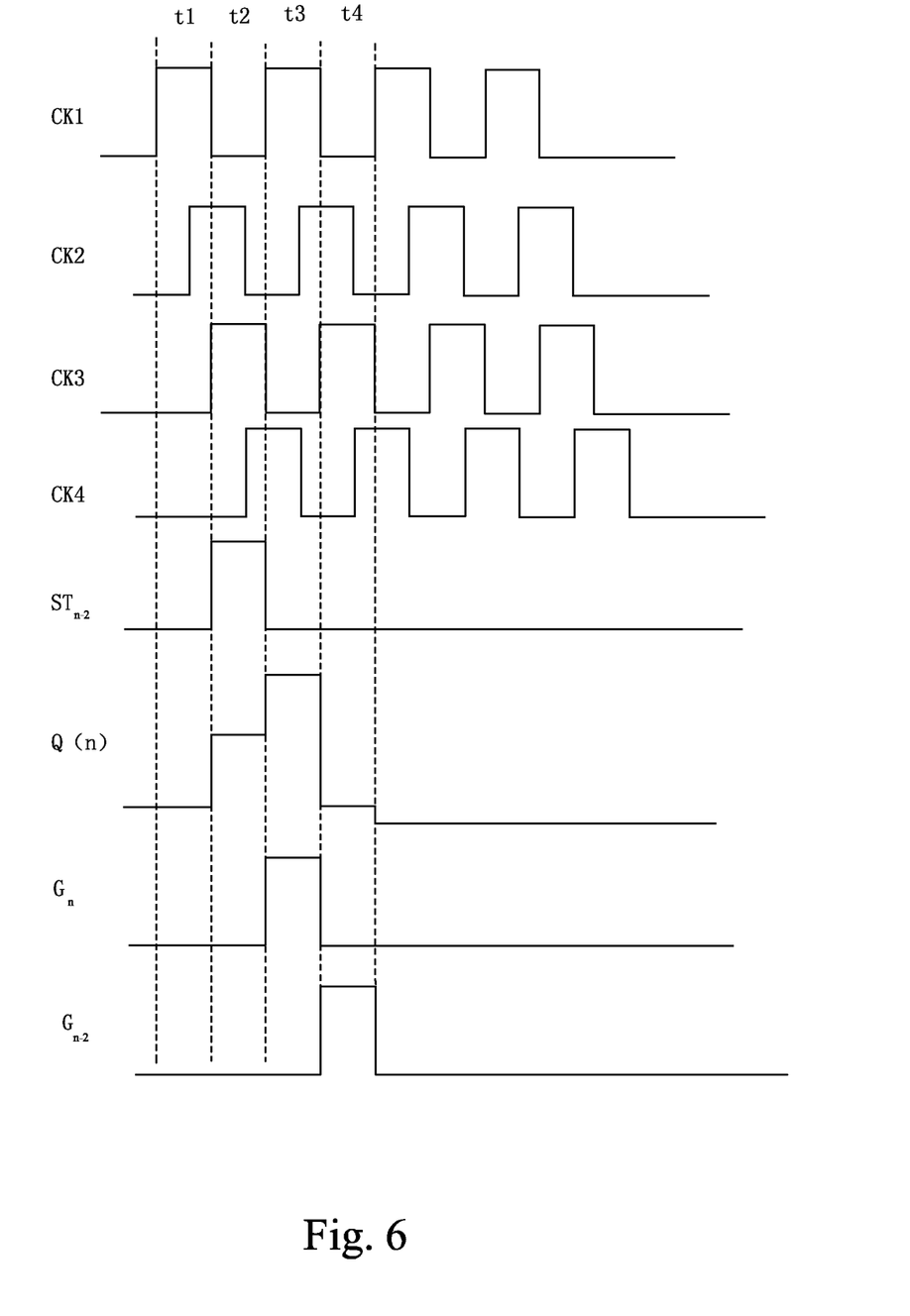
FIG. 6 is a timing diagram of the gate driver on array unit according to the present invention.

Referring to FIG. 5, each gate driver on array units utilizes a pair of clock signals with opposite phases, that are CK and CKB shown in Figure, to drive. In the present embodiment, the clock signal first input terminal 23 and the clock signal second input terminal 24 can respectively input a first clock signal CK1, a second clock signal CK2, a third clock signal CK3, and a fourth clock signal CK4 to drive the gate driver on array units. The first clock signal CK1 and the third clock signal CK3 have opposite phases, and the second clock signal CK2 and the fourth clock signal CK4 have opposite phases. The waveforms of the first clock signal CK1, the third clock signal CK3 and the second clock signal CK2, the fourth clock signal CK4 are the same, but the initial phases are different. Preferably, there is ¼ cycle difference between the initial phase of the second clock signal CK2, the fourth clock signal CK4 and that of the first clock signal CK1, the third clock signal CK3, as shown in FIG. 6. Utilizing multiple clock signals to control is beneficial to improve the control accuracy. When the clock signal first input terminal 23 and the clock signal second input terminal 24 of the n-th gate driver on array unit of the gate driver on array circuit respectively input the first clock signal CK1 and the third clock signal CK3, the clock signal first input terminal 23 and the clock signal second input terminal 24 of the (n+1)-th gate driver on array unit of the gate driver on array circuit respectively input the second clock signal CK2 and the fourth clock signal CK4.

Specifically, when the clock signal first input terminal 23 of the n-th gate driver on array unit of the gate driver on array circuit inputs the first clock signal CK1, the clock signal second input terminal 24 of the n-th gate driver on array unit of the gate driver on array circuit inputs the third clock signal CK3, the clock signal first input terminal 23 of the (n+2)-th gate driver on array unit of the gate driver on array circuit inputs the third clock signal CK3, and the clock signal second input terminal 24 of the (n+2)-th gate driver on array unit of the gate driver on array circuit inputs the first clock signal CK1. When the clock signal first input terminal 23 of the (n+1)-th gate driver on array unit of the gate driver on array circuit inputs the second clock signal CK2, the clock signal second input terminal 24 of the (n+1)-th gate driver on array unit of the gate driver on array circuit inputs the fourth clock signal CK4, the clock signal first input terminal 23 of the (n+3)-th gate driver on array unit of the gate driver on array circuit inputs the fourth clock signal CK4, and the clock signal second input terminal 24 of the (n+3)-th gate driver on array unit of the gate driver on array circuit is the second clock signal CK2.

In the present embodiment, the specific structures of the pulling-up driving unit 32, the pulling-up unit 34, and the first to the third pulling-down units 36, 37, 38 are as follows:

The pulling-up driving unit 32 is a first thin film transistor T1, the first thin film transistor T1 comprises a first gate g, a first source s and a first drain d, the first gate g and the first source s are electrically connected to the (n−2)-th signal input terminal ($ST_{n-2}$) 21, and the first drain d is electrically connected with the first to the third pulling-down units 36, 37, 38 and the pulling-up unit 34, respectively.

The pulling-up unit 34 comprises a capacitor C, a second thin film transistor T2 and a third thin film transistor T3. The second thin film transistor T2 comprises a second gate g, a second source s and a second drain d. The third thin film transistor T3 comprises a third gate g, a third source s and a third drain d. The second gate g is electrically connected with a terminal of the capacitor C, the third gate g and the third pulling-down unit 38, respectively. The second source s is electrically connected with the third drain d and the clock signal first input terminal 23. The second drain d is electrically connected with the second output terminal ($ST_n$) 28. The third source s is electrically connected with the first output terminal ($G_n$) 27, the third pulling-down unit 38 and the other terminal of the capacitor C.

The first pulling-down unit 36 comprises a fourth to a seventh thin film transistor T4, T5, T6, T7. The fourth thin film transistor T4 comprises a fourth gate g, a fourth source s and a fourth drain d. The fifth thin film transistor T5 comprises a fifth gate g, a fifth source s and a fifth drain d. The sixth thin film transistor T6 comprises a sixth gate g, a sixth source s and a sixth drain d. The seventh thin film transistor T7 comprises a seventh gate g, a seventh source s and a seventh drain d. The fourth gate g and the fourth source s are electrically connected to the clock signal first input terminal 23. The fourth drain d is electrically connected with the fifth source s, the sixth gate g and the seventh gate g. The fifth gate g is electrically connected with the first drain d, the seventh source s and the second pulling-down unit 37. The fifth drain is electrically connected to the second low-level input terminal 26. The sixth source s is electrically connected with the other terminal of the capacitor C, the second pulling-down unit 37 and the first output terminal 27. The sixth drain d is electrically connected with the first low-level input terminal 25. The seventh drain d is electrically connected with the second low-level input terminal 26.

The second pulling-down unit 37 comprises an eighth to an eleventh thin film transistor T8, T9, T10, T11. The eighth thin film transistor T8 comprises an eighth gate g, an eighth source s and an eighth drain d. The ninth thin film transistor T9 comprises an ninth gate g, an ninth source s and an ninth drain d. The tenth thin film transistor T10 comprises a tenth gate g, a tenth source s and a tenth drain d. The eleventh thin film transistor T11 comprises an eleventh gate g, an eleventh source s and an eleventh drain d. The eighth gate g and the eighth drain d are electrically connected to the clock signal second input terminal 24. The eighth source s is electrically connected with the ninth drain d, the tenth gate g and the eleventh gate g. The ninth gate g is electrically connected with the first drain s, the eleventh source s, the fifth gate g and the seventh source s. The ninth source s is electrically connected to the second low-level input terminal 26. The tenth drain d is electrically connected with the other terminal of the capacitor C, the sixth source s and the first output terminal ($G_n$) 27. The tenth source s is electrically connected with the first low-level input terminal 25. The eleventh drain d is electrically connected with the second low-level input terminal 26.

The third pulling-down unit 38 comprises a twelfth and a thirteenth thin film transistors T12, T13. The twelfth thin film transistor T12 comprises a twelfth gate g, a twelfth source s and a twelfth drain d. The thirteenth thin film transistor T13 comprises a thirteenth gate g, a thirteenth source s and a thirteenth drain d. The twelfth gate g is electrically connected with the thirteenth gate g and the (n+2)-th signal input terminal ($G_{n+2}$) 22, the twelfth drain d is electrically connected with the first drain d, the other terminal of the capacitor C, the second gate g and the third gate g. The twelfth source s is electrically connected with the first low-level input terminal 25 and the thirteenth drain d. The thirteenth source s is electrically connected with the first output terminal ($G_n$) 27 and the third source s.

Specifically, the pulse activation signal STV is added on the first thin film transistor T1 of the first and the second gate driver on array units, that is, the $ST_{n-2}$ inputs the STV signal. The first and the second gate driver on array units output signals G(1) and G(2), ST(1) and ST(2). The signal ST(1) is output to the first thin film transistor T1 of the third gate driver on array unit, so that the third gate driver on array unit outputs G(3) and ST(3). The signal ST(2) is output to the first thin film transistor T1 of the fourth gate driver on array unit, so that the fourth gate driver on array unit outputs G(4) and ST(4). The transportation of the pulse activation signal STV is mentioned above. The signal G(3) is connected to the first gate driver on array unit after being output, that is, the pulse opens the twelfth and the thirteenth thin film transistors T12, T13 of the third pulling-down unit 38. However, these two thin film transistors are connected to the first low-level $V_{ss}$. The output of G(1) at the first output terminal is pulled down to $V_{ss}$, and the pulling-down point Q(1) voltage is pulled down to $V_{ss}$ at the same time. The first pulling-down unit 36 and the second pulling-down unit 37 act at the inactive time (the scanning circuit is closed (held)) of the output of the first output terminal (Gn), which pull down the first output terminal (Gn) and the pulling-down point Q(n) to $V_{ss}$ and $V_{ss2}$. Wherein, the operation of the first pulling-down unit 36 and the clock signal input by the clock signal first input terminal 23 are synchronous, and the operation of the second pulling-down unit 37 and the clock signal input by the clock signal second input terminal 24 are synchronous.

Referring to FIG. 6, it is a waveform diagram of each input signal, output signal, clock signal and pulling-down point Q(n) of the n-th gate driver on array unit.

In the time t1, the first clock signal CK1 is high-level, the second clock signal CK2 is transformed to high-level from low-level, the third clock signal CK3 is low-level, and the fourth clock signal CK4 is low-level. The (n−2)-th gate driver on array unit outputs low-level, that is, the output signal of the (n−2)-th signal input terminal ($ST_{n-2}$) 21 of the n-th gate driver on array unit is low-level. The first thin film transistor T1 is turned off, the pulling-down point Q(n) is low-level, that is, the gate voltage of the third thin film transistor T3 is low-level. The pulling-up unit 34 is turned off, the first output terminal ($G_n$) 27 outputs low-level, the second output terminal ($ST_n$) 28 outputs low-level, and the (n+2)-th gate driver on array unit outputs low-level to the third pulling-down unit 38.

In the time t2, the first clock signal CK1 is low-level, the second clock signal CK2 is transformed to low-level from high-level, the third clock signal CK3 is high-level, and the fourth clock signal CK4 is high-level. The (n−2)-th gate driver on array unit outputs high-level, that is, the output signal of the (n−2)-th signal input terminal ($ST_{n-2}$) 21 of the n-th gate driver on array unit is high-level. The first thin film transistor T1 is turned on, the pulling-down point Q(n) is high-level, that is, the gate voltage of the third thin film transistor T3 is high-level. The capacitor C is charged, the second thin film transistor T2 is turned on, the first clock signal CK1 is low-level, the first output terminal ($G_n$) 27 outputs low-level, the second output terminal ($ST_n$) 28 outputs low-level, and the (n+2)-th gate driver on array unit outputs low-level to the third pulling-down unit 38.

In the time t3, the first clock signal CK1 is high-level, the second clock signal CK2 is transformed to high-level from low-level, the third clock signal CK3 is low-level, and the fourth clock signal CK4 is low-level. The (n−2)-th gate driver on array unit outputs low-level, that is, the output signal of the (n−2)-th signal input terminal ($ST_{n-2}$) 21 of the n-th gate driver on array unit is low-level. Because the existence of the capacitor C (after being charged) of the pulling-up unit 34 allows the gate voltage $V_g$ of the second and the third thin film transistors T2, T3 being pulled up to higher level. The first output terminal ($G_n$) 27 outputs high-level, the second output terminal ($ST_n$) 28 outputs high-level, and the (n+2)-th gate driver on array unit outputs low-level to the third pulling-down unit 38.

In the time t4, the first clock signal CK1 is low-level, the second clock signal CK2 is transformed to low-level from high-level, the third clock signal CK3 is high-level, and the fourth clock signal CK4 is high-level. The (n−2)-th gate driver on array unit outputs low-level, that is, the output signal of the (n−2)-th signal input terminal ($ST_{n-2}$) 21 of the n-th gate driver on array unit is low-level. The (n+2)-th gate driver on array unit outputs high-level to the third pulling-down unit 38, and the third pulling-down unit 38 pulls down the pulling-down point Q(n) to the first low-level $V_{ss}$.

In the inactive time of the output of the first output terminal (Gn), the first and the second pulling-down units 36, 37 pull down the voltage of the pulling-down point Q(n) to the second low-level $V_{ss2}$ under the control of the first and the third clock signal CK1, CK3. The pulling-down action of the first pulling-down unit 36 is synchronous with the first clock signal CK1, and the pulling-down action of the second pulling-down unit 37 is synchronous with the third clock signal CK3. Comparing with the existing technology, the second low-level $V_{ss2}$ is less than the first low-level $V_{ss}$ in the present invention, so that the $V_{gs}$ of the third thin film transistor T3 of the pulling-up unit 34 is pulled down to less than 0V, and then the third thin film transistor T3 is under more save turning-off state.

In summary, the gate driver on array circuit according to the present invention adds a second low-level signal in the gate driver on array unit, which uses the second low-level to decrease the voltage difference ($V_{gs}$) between the gate and the source of the thin film transistor of the first output terminal when the scanning circuit is turned off (holding), so that the leakage current of the thin film transistor is smaller, which can be controlled precisely and beneficial to improve the display quality of the LCD.

For those having ordinary skills in the art, the technical idea and the technical solution can be changed and modified according to the present invention. Any deduction or modification according to the present invention is considered encompassed in the scope of protection defined by the claims of the present invention.

What is claimed is:

1. A gate driver on array circuit, comprising multiple gate driver on array units connected in cascade, wherein the n-th gate driver on array unit of the gate driver on array circuit comprises a (n−2)-th signal input terminal, a (n+2)-th signal input terminal, a clock signal first input terminal, a clock signal second input terminal, a first low-level input terminal, a second low-level input terminal, a first output terminal and a second output terminal, wherein the first output terminal of the n-th gate driver on array unit is used to drive the active region of the array substrate;

wherein, when the n-th gate driver on array unit is one of the third to the last first gate driver on array units, the (n−2)-th signal input terminal of the n-th gate driver on array unit is electrically connected to the second output terminal of the (n−2)-th gate driver on array unit; when the n-th gate driver on array unit is the first or the second gate driver on array unit, the (n−2)-th signal input terminal is used to input a pulse activation signal; when the n-th gate driver on array unit is one of the first to the last third gate driver on array units, the second output terminal of the n-th gate driver on array unit is electrically connected to the (n−2)-th signal input terminal of the (n+2)-th gate driver on array unit, and the (n+2)-th signal input terminal of the n-th gate driver on array unit is electrically connected to the first output terminal of the (n+2)-th gate driver on array unit; when the n-th gate driver on array unit is the last first or the last second gate driver on array unit, the second output terminal of the n-th gate driver on array unit is suspended, and the (n+2)-th signal input terminal is used to input a pulse activation signal; the first low-level input terminal is used to input a first low-level, the second low-level input terminal is used to input a second low-level, and the second low-level is less than the first low-level; the n-th gate driver on array unit of the gate driver on array circuit further comprises:
a pulling-up driving unit, which is electrically connected with the (n−2)-th signal input terminal;
a pulling-up unit, which is electrically connected with the pulling-up driving unit, the clock signal first input terminal, the first output terminal and the second output terminal, respectively;
a first pulling-down unit, which is electrically connected with the clock signal first input terminal, the first low-level input terminal, the second low-level input terminal, the pulling-up driving unit and the pulling-up unit;
a second pulling-down unit, which is electrically connected with the clock signal second input terminal, the first low-level input terminal, the second low-level input terminal, the first pulling-down unit, the pulling-up driving unit and the pulling-up unit;
a third pulling-down unit, which is electrically connected with the (n+2)-th signal input terminal, the first low-level input terminal, the pulling-up driving unit, the pulling-up unit, the first pulling-down unit, the second pulling-down unit and the first output terminal; and
wherein the input signals of the clock signal first input terminal and the clock signal second input terminal are a first clock signal, a second clock signal, a third clock signal or a fourth clock signal, the first clock signal and the third clock signal have opposite phases, the second clock signal and the fourth clock signal have opposite phases, and the waveforms of the first clock signal, the third clock signal and the second clock signal, the fourth clock signal are the same, but the initial phases are different.

2. The gate driver on array circuit as claimed in claim 1, wherein, when the input signals of the clock signal first input terminal and the clock signal second input terminal of the n-th gate driver on array unit of the gate driver on array circuit are respectively the first clock signal and the third clock signal, the input signals of the clock signal first input terminal and the clock signal second input terminal of the (n+1)-th gate driver on array unit of the gate driver on array circuit are respectively the second clock signal and the fourth clock signal.

3. The gate driver on array circuit as claimed in claim 2, wherein, when the input signal of the clock signal first input terminal of the n-th gate driver on array unit of the gate driver on array circuit is the first clock signal, the input signal of the clock signal second input terminal of the n-th gate driver on array unit of the gate driver on array circuit is the third clock signal, the input signal of the clock signal first input terminal of the (n+2)-th gate driver on array unit of the gate driver on array circuit is the third clock signal, and the input signal of the clock signal second input terminal of the (n+2)-th gate driver on array unit of the gate driver on array circuit is the first clock signal.

4. The gate driver on array circuit as claimed in claim 3, wherein, when the input signal of the clock signal first input terminal of the (n+1)-th gate driver on array unit of the gate driver on array circuit is the second clock signal, the input signal of the clock signal second input terminal of the (n+1)-th gate driver on array unit of the gate driver on array circuit is the fourth clock signal, the input signal of the clock signal first input terminal of the (n+3)-th gate driver on array unit of the gate driver on array circuit is the fourth clock signal, and the input signal of the clock signal second input terminal of the (n+3)-th gate driver on array unit of the gate driver on array circuit is the second clock signal.

5. The gate driver on array circuit as claimed in claim 1, wherein the pulling-up driving unit is a first thin film transistor, the first thin film transistor comprises a first gate, a first source and a first drain, the first gate and the first source are electrically connected to the (n−2)-th signal input terminal, and the first drain is electrically connected with the first to the third pulling-down units and the pulling-up unit, respectively.

6. The gate driver on array circuit as claimed in claim 5, wherein the pulling-up unit comprises a capacitor, a second thin film transistor and a third thin film transistor, the second thin film transistor comprises a second gate, a second source and a second drain, the third thin film transistor comprises a third gate, a third source and a third drain, the second gate is electrically connected with a terminal of the capacitor, the first drain, the third gate and the third pulling-down unit, respectively, the second source is electrically connected with the third drain and the clock signal first input terminal, the second drain is electrically connected with the second output terminal, and the third source is electrically connected with the first output terminal, the third pulling-down unit and the other terminal of the capacitor.

7. The gate driver on array circuit as claimed in claim 6, wherein the first pulling-down unit comprises a fourth to a seventh thin film transistor, the fourth thin film transistor comprises a fourth gate, a fourth source and a fourth drain, the fifth thin film transistor comprises a fifth gate, a fifth source and a fifth drain, the sixth thin film transistor comprises a sixth gate, a sixth source and a sixth drain, the seventh thin film transistor comprises a seventh gate, a seventh source and a seventh drain, the fourth gate and the fourth source are electrically connected to the clock signal first input terminal, the fourth drain is electrically connected with the fifth source, the sixth gate and the seventh gate, the fifth gate is electrically connected with the first drain, the seventh source and the second pulling-down unit, the fifth drain is electrically connected to the second low-level input terminal, the sixth source is electrically connected with the other terminal of the capacitor, the second pulling-down unit and the first output terminal, the sixth drain is electrically connected with the first low-level input terminal, and the seventh drain is electrically connected with the second low-level input terminal.

8. The gate driver on array circuit as claimed in claim 7, wherein the second pulling-down unit comprises an eighth to an eleventh thin film transistor, the eighth thin film transistor comprises an eighth gate, an eighth source and an eighth drain, the ninth thin film transistor comprises an ninth gate, an ninth source and an ninth drain, the tenth thin film transistor comprises a tenth gate, a tenth source and a tenth drain, the eleventh thin film transistor comprises an eleventh gate, an eleventh source and an eleventh drain, the eighth gate and the eighth drain are electrically connected to the clock signal second input terminal, the eighth source is electrically connected with the ninth drain, the tenth gate and the eleventh gate, the ninth gate is electrically connected with the first drain, the eleventh source, the fifth gate and the seventh source, the ninth source is electrically connected to the second low-level input terminal, the tenth drain is electrically connected with the other terminal of the capacitor, the sixth source and the first output terminal, the tenth source is electrically connected with the first low-level input terminal, and the eleventh drain is electrically connected with the second low-level input terminal.

9. The gate driver on array circuit as claimed in claim 8, wherein the third pulling-down unit comprises a twelfth and a thirteenth thin film transistor, the twelfth thin film transistor comprises a twelfth gate, a twelfth source and a twelfth drain, the thirteenth thin film transistor comprises a thirteenth gate, a thirteenth source and a thirteenth drain, the twelfth gate is electrically connected with the thirteenth gate and the (n+2)-th signal input terminal, the twelfth drain is electrically connected with the first drain, the other terminal of the capacitor, the second gate and the third gate, the twelfth source is electrically connected with the first low-level input terminal and the thirteenth drain, and the thirteenth source is electrically connected with the first output terminal and the third source.

10. A gate driver on array circuit, comprising multiple gate driver on array units connected in cascade, wherein the n-th gate driver on array unit of the gate driver on array circuit comprises a (n−2)-th signal input terminal, a (n+2)-th signal input terminal, a clock signal first input terminal, a clock signal second input terminal, a first low-level input terminal, a second low-level input terminal, a first output terminal and a second output terminal, wherein the first output terminal of the n-th gate driver on array unit is used to drive the active region of the array substrate;

wherein, when the n-th gate driver on array unit is one of the third to the last first gate driver on array units, the (n−2)-th signal input terminal of the n-th gate driver on array unit is electrically connected to the second output terminal of the (n−2)-th gate driver on array unit; when the n-th gate driver on array unit is the first or the second gate driver on array unit, the (n−2)-th signal input terminal is used to input a pulse activation signal; when the n-th gate driver on array unit is one of the first to the last third gate driver on array units, the second output terminal of the n-th gate driver on array unit is electrically connected to the (n−2)-th signal input terminal of the (n+2)-th gate driver on array unit, and the (n+2)-th signal input terminal of the n-th gate driver on array unit is electrically connected to the first output terminal of the (n+2)-th gate driver on array unit; when the n-th gate driver on array unit is the last first or the last second gate driver on array unit, the second output terminal of the n-th gate driver on array unit is suspended, and the (n+2)-th signal input terminal is used to input a pulse activation signal; the first low-level input terminal is used to input a first low-level, the second low-level input terminal is used to input a second low-level, and the second low-level is less than the first low-level; the n-th gate driver on array unit of the gate driver on array circuit further comprises:

a pulling-up driving unit, which is electrically connected with the (n−2)-th signal input terminal;

a pulling-up unit, which is electrically connected with the pulling-up driving unit, the clock signal first input terminal, the first output terminal and the second output terminal, respectively;

a first pulling-down unit, which is electrically connected with the clock signal first input terminal, the first low-level input terminal, the second low-level input terminal, the pulling-up driving unit and the pulling-up unit;

a second pulling-down unit, which is electrically connected with the clock signal second input terminal, the first low-level input terminal, the second low-level input terminal, the first pulling-down unit, the pulling-up driving unit and the pulling-up unit;

a third pulling-down unit, which is electrically connected with the (n+2)-th signal input terminal, the first low-level input terminal, the pulling-up driving unit, the pulling-up unit, the first pulling-down unit, the second pulling-down unit and the first output terminal;

wherein, the input signals of the clock signal first input terminal and the clock signal second input terminal are a first clock signal, a second clock signal, a third clock signal or a fourth clock signal, the first clock signal and the third clock signal have opposite phases, the second clock signal and the fourth clock signal have opposite phases, and the waveforms of the first clock signal, the third clock signal and the second clock signal, the fourth clock signal are the same, but the initial phases are different; wherein, when the input signals of the clock signal first input terminal and the clock signal second input terminal of the n-th gate driver on array unit of the gate driver on array circuit are respectively the first clock signal and the third clock signal, the input signals of the clock signal first input terminal and the clock signal second input terminal of the (n+1)-th gate driver on array unit of the gate driver on array circuit are respectively the second clock signal and the fourth clock signal;

wherein, when the input signal of the clock signal first input terminal of the n-th gate driver on array unit of the gate driver on array circuit is the first clock signal, the input signal of the clock signal second input terminal of the n-th gate driver on array unit of the gate driver on array circuit is the third clock signal, the input signal of the clock signal first input terminal of the (n+2)-th gate driver on array unit of the gate driver on array circuit is the third clock signal, and the input signal of the clock signal second input terminal of the (n+2)-th gate driver on array unit of the gate driver on array circuit is the first clock signal;

wherein, when the input signal of the clock signal first input terminal of the (n+1)-th gate driver on array unit of the gate driver on array circuit is the second clock signal, the input signal of the clock signal second input terminal of the (n+1)-th gate driver on array unit of the gate driver on array circuit is the fourth clock signal, the input signal of the clock signal first input terminal of the (n+3)-th gate driver on array unit of the gate driver on array circuit is the fourth clock signal, and the input signal of the clock signal second input terminal of the (n+3)-th gate driver on array unit of the gate driver on array circuit is the second clock signal;

wherein, the pulling-up driving unit is a first thin film transistor, the first thin film transistor comprises a first gate, a first source and a first drain, the first gate and the first source are electrically connected to the (n−2)-th signal input terminal, and the first drain is electrically connected with the first to the third pulling-down units and the pulling-up unit, respectively.

11. The gate driver on array circuit as claimed in claim 10, wherein the pulling-up unit comprises a capacitor, a second thin film transistor and a third thin film transistor, the second thin film transistor comprises a second gate, a second source and a second drain, the third thin film transistor comprises a third gate, a third source and a third drain, the second gate is electrically connected with a terminal of the capacitor, the first drain, the third gate and the third pulling-down unit, respectively, the second source is electrically connected with the third drain and the clock signal first input terminal, the second drain is electrically connected with the second output terminal, and the third source is electrically connected with the first output terminal, the third pulling-down unit and the other terminal of the capacitor.

12. The gate driver on array circuit as claimed in claim 11, wherein the first pulling-down unit comprises a fourth to a seventh thin film transistor, the fourth thin film transistor comprises a fourth gate, a fourth source and a fourth drain, the fifth thin film transistor comprises a fifth gate, a fifth source and a fifth drain, the sixth thin film transistor comprises a sixth gate, a sixth source and a sixth drain, the seventh thin film transistor comprises a seventh gate, a seventh source and a seventh drain, the fourth gate and the fourth source are electrically connected to the clock signal first input terminal, the fourth drain is electrically connected with the fifth source, the sixth gate and the seventh gate, the fifth gate is electrically connected with the first drain, the seventh source and the second pulling-down unit, the fifth drain is electrically connected to the second low-level input terminal, the sixth source is electrically connected with the other terminal of the capacitor, the second pulling-down unit and the first output terminal, the sixth drain is electrically connected with the first low-level input terminal, and the seventh drain is electrically connected with the second low-level input terminal.

13. The gate driver on array circuit as claimed in claim 12, wherein the second pulling-down unit comprises an eighth to an eleventh thin film transistor, the eighth thin film transistor comprises an eighth gate, an eighth source and an eighth drain, the ninth thin film transistor comprises an ninth gate, an ninth source and an ninth drain, the tenth thin film transistor comprises a tenth gate, a tenth source and a tenth drain, the eleventh thin film transistor comprises an eleventh gate, an eleventh source and an eleventh drain, the eighth gate and the eighth drain are electrically connected to the clock signal second input terminal, the eighth source is electrically connected with the ninth drain, the tenth gate and the eleventh gate, the ninth gate is electrically connected with the first drain, the eleventh source, the fifth gate and the seventh source, the ninth source is electrically connected to the second low-level input terminal, the tenth drain is electrically connected with the other terminal of the capacitor, the sixth source and the first output terminal, the tenth source is electrically connected with the first low-level input terminal, and the eleventh drain is electrically connected with the second low-level input terminal.

14. The gate driver on array circuit as claimed in claim 13, wherein the third pulling-down unit comprises a twelfth and a thirteenth thin film transistor, the twelfth thin film transistor comprises a twelfth gate, a twelfth source and a twelfth drain, the thirteenth thin film transistor comprises a thirteenth gate, a thirteenth source and a thirteenth drain, the twelfth gate is electrically connected with the thirteenth gate and the (n+2)-th signal input terminal, the twelfth drain is electrically connected with the first drain, the other terminal of the capacitor, the second gate and the third gate, the twelfth source is electrically connected with the first low-level input terminal and the thirteenth drain, and the thirteenth source is electrically connected with the first output terminal and the third source.

* * * * *